United States Patent
Birk et al.

(10) Patent No.: US 7,401,272 B1
(45) Date of Patent: Jul. 15, 2008

(54) APPARATUS AND METHOD FOR HIGH SPEED SAMPLING OR TESTING OF DATA SIGNALS USING AUTOMATED TESTING EQUIPMENT

(75) Inventors: Gershom Birk, Coquitlam (CA); Kenneth William Ferguson, Burnaby (CA)

(73) Assignee: PMC-Sierra, Inc., Burnaby, BC (CA)

( * ) Notice: Subject to any disclaimer, the term of this patent is extended or adjusted under 35 U.S.C. 154(b) by 250 days.

(21) Appl. No.: 10/096,331

(22) Filed: Mar. 8, 2002

Related U.S. Application Data

(60) Provisional application No. 60/274,440, filed on Mar. 9, 2001.

(51) Int. Cl.
*G11R 31/28* (2006.01)
*G11C 29/00* (2006.01)

(52) U.S. Cl. ..................................................... 714/724
(58) Field of Classification Search ................. 714/724, 714/736, 738, 726, 30
See application file for complete search history.

(56) References Cited

U.S. PATENT DOCUMENTS

| | | | | |
|---|---|---|---|---|
| 3,976,917 | A * | 8/1976 | Fork ............................ | 361/21 |
| 5,051,997 | A * | 9/1991 | Sakashita et al. ............. | 714/732 |
| 5,617,429 | A * | 4/1997 | Goto ........................... | 714/736 |
| 5,953,684 | A * | 9/1999 | Alexander ................... | 702/108 |
| 6,182,257 | B1 * | 1/2001 | Gillingham ................. | 714/733 |
| 6,256,760 | B1 * | 7/2001 | Carron et al. ................ | 714/726 |
| 6,269,455 | B1 * | 7/2001 | Deas ............................ | 714/29 |
| 6,346,911 | B1 * | 2/2002 | King ....................... | 342/357.06 |
| 6,430,718 | B1 * | 8/2002 | Nayak ......................... | 714/727 |
| 6,442,724 | B1 * | 8/2002 | Augarten ..................... | 714/738 |
| 6,459,685 | B1 * | 10/2002 | Mahe .......................... | 370/313 |
| 6,536,005 | B1 * | 3/2003 | Augarten ..................... | 714/723 |
| 6,647,523 | B2 * | 11/2003 | Manning ..................... | 714/720 |
| 6,694,462 | B1 * | 2/2004 | Reiss et al. .................. | 714/724 |
| 6,697,981 | B2 * | 2/2004 | Shigeta ....................... | 714/736 |
| 6,751,761 | B1 * | 6/2004 | Tendo ......................... | 714/716 |
| 2002/0099513 | A1 * | 7/2002 | Keezer ....................... | 702/125 |

OTHER PUBLICATIONS

"Dantes HP83000 Multimedia Series: Technical Description" pp. 1-3 of 3.
"Dantes HP94000 ATE Module: Technical Description" pp. 1-5 of 5. World Wide Web at http://www.virtualtest.com/datasheets/hp9490dantes.html pp. 1-5 of 5. Mar. 3, 2001.
"Dantes: Mixed Signal Test Debug Without the Tester" p. 1 of 1.

(Continued)

*Primary Examiner*—Phung M. Chung
(74) *Attorney, Agent, or Firm*—Stephen J. LeBlanc; Quine Intellectual Property Law Group

(57) ABSTRACT

A test method allows testing of source-synchronous high-speed wide busses on automatic testing equipment for at-speed characterization and production at-speed testing. An integrated circuit that is verified using the method and systems including such an integrated circuit are also disclosed. The invention can enable sampling or testing of signals or test pins that that are running very fast, particular compared to available automatic testing equipment for testing these device. The invention uses data recovery emulation on various types of automated test equipment to capture output data for further, more sophisticated analysis.

22 Claims, 4 Drawing Sheets

OTHER PUBLICATIONS

"Digital Virtual Tester HP94000: Technical Description" pp. 1-3 of 3.
Agilent Technologies (1996) "HP Unveils Test Solution for Multimedia Chip Manufacturers" Press Release, Washington, Oct. 21, 1996.
Agilent Technologies (2001) "89600 Series Vector Signal Analyzers." p. 1 of 1.
Agilent Technologies (2001) "Agilent SOC Test Technology Overview." p. 1 of 1.
Agilent Technologies (2001) "Integrated Design Software and Test Instrumentation Solution." p. 1 of 1.
Applicos Measurement & Control, "ATX5002: Accurate A/D- and D/A- converter tester in combination with ATE or with a PC in a bench setup." World Wide Web at http://www.applicos.nl/atx5002.html pp. 1-3 of 3; Jun. 23, 2001.
Applicos Measurement & Control, "ATX7002: Accurate A/D- and D/A- converter tester in combination with ATE or with a PC in a bench setup." World Wide Web at http://www.applicos.nl/atx7002.html pp. 1-4 of 4; Jun. 23, 2001.
Applicos Measurement & Control, "HSX2012: System for testing and characterizing high-speed A/D- and D/A-converters." World Wide Web at http://www.applicos.nl/hsx2012.html pp. 1-2 of 2; Jul. 28, 2001.
Applicos Measurement & Control, "SBX16: Modular System to build customized A/D and D/A converter test systems quick and cost efficient." World Wide Web at http://www.applicos.nl/sbx16.html pp. 1-7 of 7; Jun. 23, 2001.
August Automation, Inc. (2001) "Self-Test Programming for Automatic Test Equipment." Written by John August as an Associate Engineer at Westinghouse Electric Corporation.
Elmore (2000) "Case Study: Modular ATE System Design." Racal Instruments, Inc. On the World Wide Web at http://www.bitpipe.com/detail/RES/974146926_274.html pp. 1-11 of 11.
Exatron, Inc. (2002) "The expert Tester and Programmer—Theory of Operation." World Wide Web at http://www.exatron.com/products/test-program/expert/operation.html pp. 1-2 of 2. Jan. 11, 2002.
Gupta, et al. (1998) "Routing Lookups in Hardware at Memory Access Speeds." IEEE: Proceedings of the IEEE Infocom 98.
Hampton (1997) "Automatic Test Equipment." World Wide Web at http://www.teleport.com/~kenh.
Integrated Measurement Systems, Inc. (1997) "Dantes: Virtual Test for Mixed-Signal Featuring Turbomodel Emulation Technology." World Wide Web at http://www.virtualtest.com pp. 1-2 of 2.
Katcher (1999) "The Virtures of Virtual Test for Fabless IC Developers." Fabless Forum, vol. 6, No. 3.
Lehighton Electronics, Inc. "Hewlett Packard Testers" World Wide Web at http://www.lehighton.com/PC_Boards/HP_Testers/hp_testers.html pp. 1-3 of 3; Oct. 8, 1999.
PMC-Sierra, Inc. "PM5310 TBS: TelecomBus Serializer for 2.5 Gbit/s Interconnect." World Wide Web at http://www.pmc-sierra.com/products/details/pm5310/ (pdf) pp. 1-2 of 2. Copyright PMC-Sierra, Inc. Mar. 2000.
PMC-Sierra, Inc. "PM5372 TSE: 40Gbit/s Transport Switching Element." World Wide Web http://www.pmc-sierra.com/products/details/pm5372/ (pdf) pp. 1-2 of 2. Copyright PMC-Sierra, Inc. Mar. 2000.
PMC-Sierra, Inc. "PM5381 S/UNI®-2488: SATURN® User Network Interface for 2488 Mbit/s" World Wide Web at http://www.pmc-sierra.com/products/details/pm5381/ (pdf) pp. 1-2 of 2. Copyright PMC-Sierra, Inc. Mar. 2000.
Rice (2000) "Component Testing Programmable Integrated Circuits Increases End Product Yield" World Wide Web at http://www.sourcee.com/pdfs/testingw.pdf pp. 1-11 of 11. May 26, 2000. Copyright Source Electronics Corporation.
Stoffels (1996) "Cost Effective Frequency Measurement for Production Testing" IEEE International Test Conference, paper 26.3; pp. 708-716.
Teradyne, Inc. (2001) "Integra J750: Program Abstracts." pp. 1-14 of 14.

* cited by examiner

APPARATUS AND METHOD FOR HIGH SPEED SAMPLING OR TESTING OF DATA SIGNALS USING AUTOMATED TESTING EQUIPMENT

CROSS REFERENCE TO RELATED APPLICATIONS

This application claims priority from provisional patent application 60/274,440 filed 9 Mar. 2001, incorporated herein by reference.

FIELD OF THE INVENTION

The present invention relates to electronic circuits. More particularly, the present invention according to specific embodiments is related to a method and/or associated apparatus and/or system for performing functional testing of high speed devices. According to further embodiments, the present invention is related to a method for sampling high speed data signals using test equipment.

COPYRIGHT NOTICE

Permission is hereby granted to make copies of this application and parts thereof solely in connection with the making of facsimile copies of this patent document in accordance with applicable law; all other rights are reserved, and all other reproduction, distribution, creation of derivative works based on the contents, public display, and public performance of the application or any part thereof are prohibited by the copyright laws.

BACKGROUND

A number of different tests may be commonly performed to validate or test advanced integrated circuits (ICs). For example, a SCAN TEST scans an IC based on known input and expected output strings. An $I_{DD}Q$ test measures the quiescent current on a power pin (such as $V_{DD}$) to check for current leaks or shorts within an IC device.

The most rigorous testing, however, and generally the most difficult to perform, is commonly referred to as "functional" testing. Ideally, a functional test runs the device at rated speed and ensures that the device works as intended (e.g. provides "at speed" the expected outputs). For advanced ICs, a "functional test" generally requires advanced automated test equipment (ATE).

An alternative mechanism for performing a type of functional test is to perform a LOOP TEST e.g. by connecting the transmit and receive pins. However, this method is not as good as a true functional test because a defect in one pin may be masked by an enhanced performance by another pin.

A variety of ATE equipment is known in the art. Generally such equipment is able to drive the input of up to all input pins and sample the output of up to all output pins. This can be particularly challenging for high speed chips (such as IC with data inputs and/or outputs operating at up to about 770 MHz) because it can be a challenge for an ATE to keep up with the operating speeds of an IC under test.

Some types of Automated Test Equipment (ATE) used in digital IC functional testing provides either a pass or a fail result for an output pin up to each output pin based on a sample taken from an output pin of a Device Under Test (DUT) at a fixed time (sometimes referred to as a strobe). The pass or fail result for an output pin is typically based on comparing the output of the output to a pattern of expected outputs, which is commonly stored in some types of ATEs in a pattern memory. Test results are commonly captured in some types of ATEs in a capture memory.

As will be understood in the art, a DUT can include any type of information or digital or signal processing device, including but not limited to a packaged integrated circuit, a device on a wafer probed before packaging, a system comprising multiple circuits or ICs, etc. A pin may refer to a pin on a packaged IC, a pad on a wafer, or an output pin on an information or communication system.

Some types of ATE systems have a pattern memory (often a separate memory or memory area for each pin under test (PUT)) and a capture memory for each pin. At the appropriate start time, the ATE compares the output of the DUT with the pattern in the pattern memory and can store results of such a compare in the capture memory. Thus, the capture memory will indicate whether any test failed on a pin and may indicate which test failed or precisely when the test failed.

An implicit requirement of this type of testing is that the DUT output logic states are deterministic and repeatable in time over the small fluctuations in the otherwise tightly controlled operating conditions and manufacturing variations. Unfortunately, this model of the DUT fails to apply when the period of the output data is very small. With increased output operating frequency, the time that the expected data sequence reaches the tester pins (e.g. the delay of the data in reaching the pins) varies so much in relation to the period that setting a fixed time within the cycle to strobe the outputs is not possible. Consider the following analysis.

Referring to FIG. 1, the time at which a known data sequence begins to be transmitted from the DUT is normally deterministic, and can be expressed as a number N of bit periods T, plus a phase offset, $\phi$, as shown in Eq. 1

$$t_s = NT + \frac{\phi T}{2\pi} \qquad \text{(eq. 1)}$$

At low speeds, it is taken for granted that N never changes. More importantly, the deviation between the best and worst case $\phi$ is less then half a bit period. In that case, the strobe time is fixed between best and worst case, guaranteeing that the device's behavior will be observed at the proper time.

As frequency increases, the bit period is smaller than the maximum deviation of $\phi$ so there is no single fixed strobe time that will not reject good DUTs. In addition to this dilemma, serializer/deserializer circuits (SERDES) may be included on DUTs as functional blocks and there could be added variation on the phase depending on the status of the divided-by-N counter of the SERDES (where N is the ratio of the parallel to serial conversion).

Some prior systems use a search test built into some ATEs. In this test method the functional test is run multiple times until the correct strobe location if found, as shown in FIG. 2. It is mainly used for characterization because it is very time consuming, especially for devices that have a long PLL lock time.

A second solution uses an external time measurement unit (TMU) and a special pattern to find the strobe time.

The first method is mainly used for characterization and debugging. Use in production test was abandoned long ago and is no longer useful to at-speed testing because: (a) This solution requires the functional test to be run in every iteration of the loop. Depending on the strobe time search depth, many passes are typically required, resulting in a long total test time; and (b) This method applies PER PIN. Given that the time of (a) is tolerable (which it is not in some cases), the search must be done for every high speed pin being tested. Multiply the time of (a) by the number of pins and it becomes clear that this solution is quite limited and not at all applicable to, for example, devices with wide, high speed busses.

The second method is sometimes used in high-speed IC production testing. It's disadvantages are: (a) The data pattern from the device is limited to a train of 0's followed by a pulse. There may be are variants to this restriction but in general the number of possible patterns is limited; (b) Test time can be 100 ms or more per measurement per pin; (c) The test method is not easily scalable to wide busses.

This measurement cannot be used for devices with multiple high speed outputs because: (a) The TMU can only measure one pin at a time. To scale means to measure pins sequentially, which increases test time, or to use multiple TMU's, a solution that becomes physically and financially cumbersome with increasing bus width; and (b) Some devices do not function properly without a specific data pattern (e.g. a valid oc48 frame). It is not possible to test such a device because the pattern requirements for the test.

OTHER REFERENCES

1. Ralf Stoffels, "Cost Effective Frequency Measurement for Production Testing," International Test Conference 1996 Proceedings: Test and Design Validity, pp. 708-716, 1996

SUMMARY

The present invention, in various embodiments, involves procedures for testing digital processing systems or modules or components or for sampling digital data.

According to specific embodiments, the present invention can enable sampling or testing of signals or test pins that that are running very fast, particular compared to available ATE for testing these device. According to specific embodiments, the present invention can implement a Data Recovery Emulation (DRE) on various types of automated test equipment (ATE) to effectively use such equipment to capture output data for further, more sophisticated analysis.

The invention may be used in a variety of applications and situations that require advanced testing or sampling as described herein. The present invention may also be incorporated into a test system or self-test system or other sampling system to facilitate testing.

A further understanding of the invention can be had from the detailed discussion of specific embodiments and specific products incorporating aspects of the invention below. For purposes of clarity, this discussion refers to devices, methods, and concepts in terms of specific examples. However, the method of the present invention may operate with a variety of types of devices and equipment and in a variety of applications. It is therefore intended that the invention not be limited except as specifically provided in the attached claims.

Furthermore, it is well known in the art that logic systems and methods such as described herein can include a variety of different components and different functions in a modular fashion. Different embodiments of the invention can include different mixtures of elements and functions and may group various functions as parts of various elements. For purposes of clarity, the invention is described in terms of systems that include many different innovative components and innovative combinations of innovative components and known components. No inference should be taken to limit the invention to combinations containing all of the innovative components listed in any illustrative embodiment in this specification.

For the sake of clarity, the invention will be explained herein with respect to specific embodiments, in some cases including specific numbers of such elements as buffers, communication lines, registers, bit widths, or other components. It will be clear from the teachings herein to those of skill in the art that the invention may be deployed in many alternative logic applications. It is inherent in the art that logic devices and processes and communications devices can be highly variable in the arrangement and configuration of different components. Described examples should therefore been taken as illustrations and not seen as limiting the invention. In order to facilitate description, the following discussion will describe the present invention in terms of particular methods and architectures for testing digital equipment. However, the methods of the present invention are applicable to other test systems or signal sampling systems.

Functional aspects of the invention that are implemented on a computer or computer circuitry, as will be understood from the teachings herein, may be implemented or accomplished using any appropriate implementation environment or programming language, such as C, C++, Cobol, Pascal, Java, Java-script, assembly or machine code programming, custom logic circuits and languages for specifying same (RTL etc.) In some embodiments, methods and/or systems described or claimed herein may be wholly incorporated into a programmed information device, either for emulation or usage purposes.

All references, publications, patents, and patent applications cited herein are hereby incorporated by reference in their entirety for all purposes.

DETAILED DESCRIPTION OF SPECIFIC EMBODIMENTS

According to specific embodiments of the present invention, the present invention provides a method and/or mechanism able to test at-speed in a relatively short time and overcomes disadvantages of prior systems.

The following sections discuss various aspects of the present invention according to specific embodiments. The present invention in specific embodiments involves implementing a Data Recovery Emulation (DRE) method for at-speed testing. According to specific embodiments of the invention, with a suitable propagation delay test, the complete at-speed test can be performed without the need of external equipment or relays, and the test can be done on wide high-speed busses in a very short time (some experimental results: test time=4.5 ms per pin, whereas prior systems required hundreds of ms per pin).

ATE Capture Memory

ATEs as generally known in the art have a type of memory typically referred to as "capture-memory" (also known as "fail memory"). This memory is used by the ATE interface software to log the failing results on a pin in a functional test. This information is usually used by the ATE user software for displaying the failed vectors for debugging during program development.

This memory is generally much smaller than the ATE's pattern memory. For example, the HP-83000 has 8K of capture memory, but 16M of pattern memory; the ITS-9000KX has 124K of capture memory and 64M of pattern memory. In both cases the capture memory contents are available through such accesses as machine-level firmware commands (e.g. in the HP83000) or "c" API (applications programming interface) function calls (e.g. in the ITS-9000 series of ATE).

Setting up the Capture Memory for Data Recovery

Figure 1:
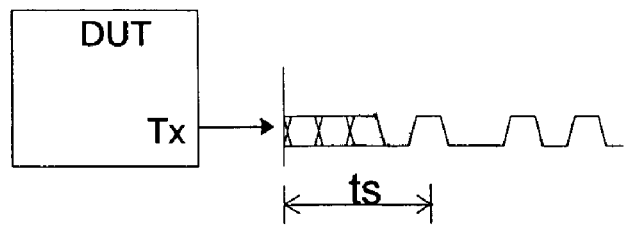
FIG. 1 illustrates as an example a situation where the time at which a known data sequence begins to be transmitted from a device under test (DUT) is normally deterministic and can be expressed as a number N of bit periods T plus a phase offset.
Figure 2:
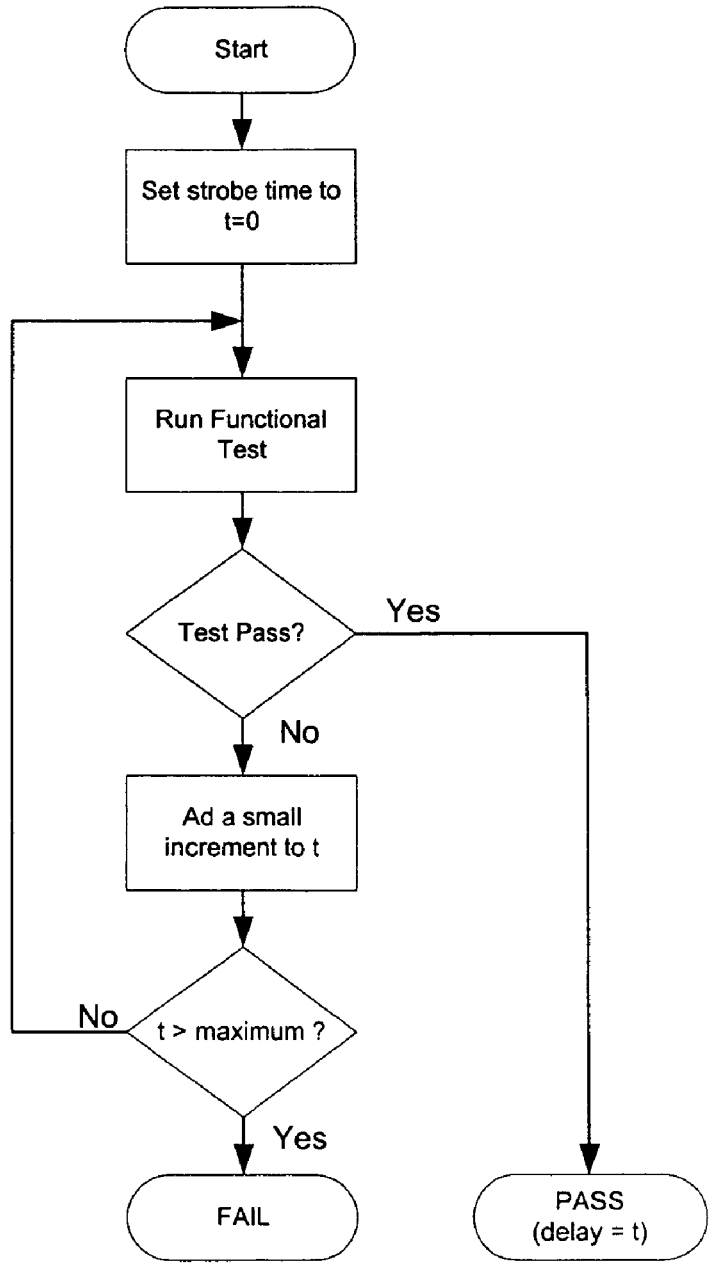
FIG. 2 is a flowchart of propagation delay parameter search on ATE.
Figure 3:
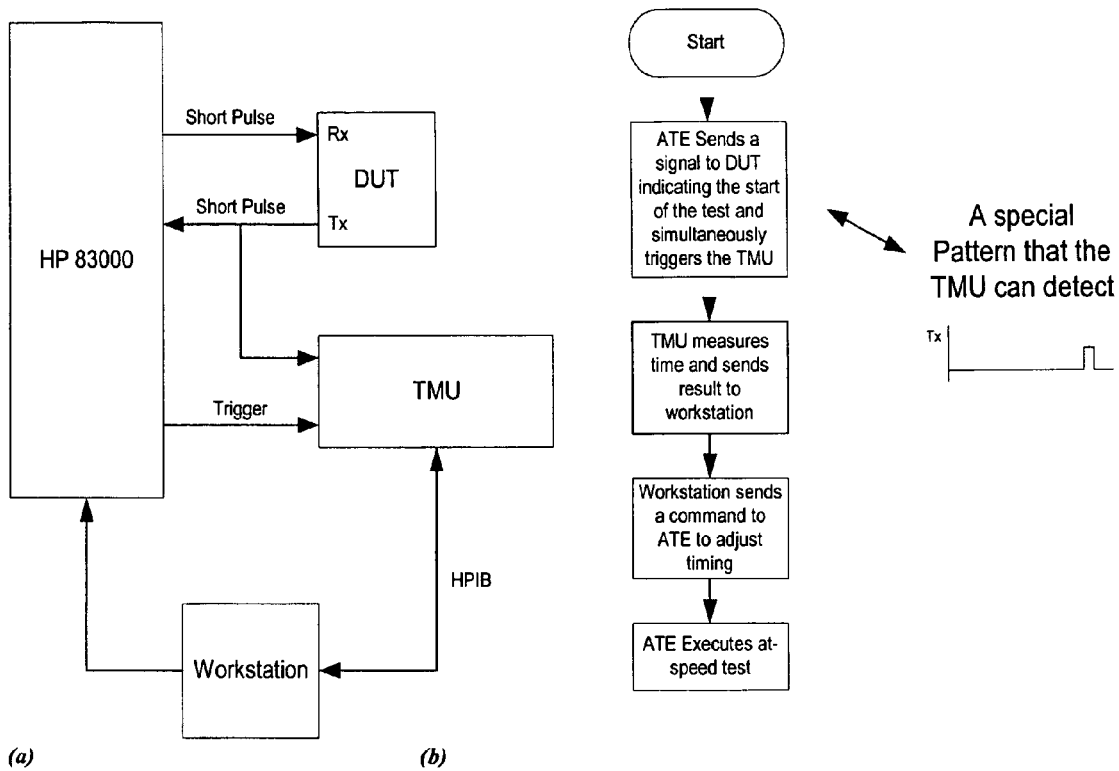
FIG. 3(a) illustrates equipment setup for delay measurement using external TMU, and (b) illustrates a flowchart for the test.

According to specific embodiments of the present invention, this capture-memory can instead be used to recover data by setting the expected pattern using any mechanism allowed or provided with a particular ATE to always "compare for 0 data". With this condition, the capture-memory will contain a pass result for every 0 detected on the pin under test (PUT) and a fail for every 1 detected on the PUT. (In standard ATE's, the representation of a pass or fail can be read through firmware or API and interpreted and stored as an ASCII or binary value. For example, the representation for a fail can be interpreted and stored as an ASCII "0" and the representation for a fail can be interpreted and stored as ASCII "1".) By modifying the expected data condition to expect 0, the actual data that was sent from the device to the tester is logged in the capture memory, which can be subsequently stored in an array as 1's and 0's. For a slow speed test with the output strobe time fixed in the center of the expected output data eye, the data that the device outputs is exactly represented in this array. (It will be understood to those of ordinary skill in the art from the teachings provided herein that complement values may be substituted for the values above.) As an example, FIG. 3(a) illustrates equipment setup for delay measurement using external TMU, and (b) illustrates a flowchart for the test.

Suppose that the data coming from the device is synchronous to the tester, and the phase is known and constant, but the starting time of a particular bit sequence of interest (e.g. a packet or cell) is not known or not deterministic. On the tester, one can set the strobe time to be exactly in the middle of the data eye, but the data that the tester samples is likely shifted in time one way or the other. Thus, comparing the captured data to a fixed pattern in the pattern memory will always produce a failing result when the data stream does not precisely coincide with the pattern memory.

This case can be tested using the capture-memory data recovery setup described above. Rather than place the expected data in the tester pattern (or comparable) memory, the expected data is kept in an array in a tester's workstation's memory. Then, the data recovery method is applied and an array of 1's and 0's representing the device's output data stream is uploaded from the tester into the workstation memory. A search algorithm can then be used to determine whether the data sequence captured from the tester exists bit-for-bit somewhere in the expected data sequence. If the expected data is the N bit array E and the captured data is the M bit array C then the search can have the simple form:

```
result=FAIL;
i=0;
j=0;
while( (result==FAIL) && (i<N−M) ) {
    while( E[i+j] == C[j]) {
        j++;
        if (j==M) {result=PASS; break; }; }
    i=0;
    i++; }
```

According to further specific embodiments of the present invention, it is possible to set the capture memory to any pattern (including the expected pattern) and modify the algorithm to perform a bitwise "exclusive-or" on the capture memory. Suppose the pattern is programmed to be a data sequence represented by the array V (this need not be the same as the expected data). Then the algorithm above can be modified as follows in according with specific embodiments of the invention:

```
result=FAIL;
i=0;
j=0;
while( (result==FAIL) && (i<N−M) ) {
    while( E[i+j]==xor( C[j], V[j]) ) {
        j++;
        if (j==M) { result=PASS; break; }; }
    j=0;
    j++; }
```

In essence, the all-zero pattern described initially is a degenerate case of this algorithm, where the pattern is programmed to all-zeros (V=[0, 0 . . . 0]) such that, XOR(C[j], V[j])=C[j]. In other words, according to specific embodiments of the present invention, the pattern need not be zero, though the selected pattern must generally be known and be compensated for.

Data Recovery in a More Complex Case Using a Workstation

Suppose that the data coming from the device has both an unknown phase and an unknown starting time. In this case, there is no way to set the strobe time to ensure that the center of the data eye will be found. However, the tester can be used in a novel manner to oversample the data stream. As long as the tester can perform two or more strobes in the time of one bit period, one can set the strobe times such that at least one of the strobes will not fall on an edge (depending upon eye opening at the point of measurement, more strobes may be needed. For example, if the eye-opening is one third of the bit period then three or four strobes are needed). The one or more strobes that do not fall on an edge will have error map data that matches some part of the expected data. Unfortunately, it is not known which strobe's data is valid, and it is not known where in the data stream it will match.

Figure 4:
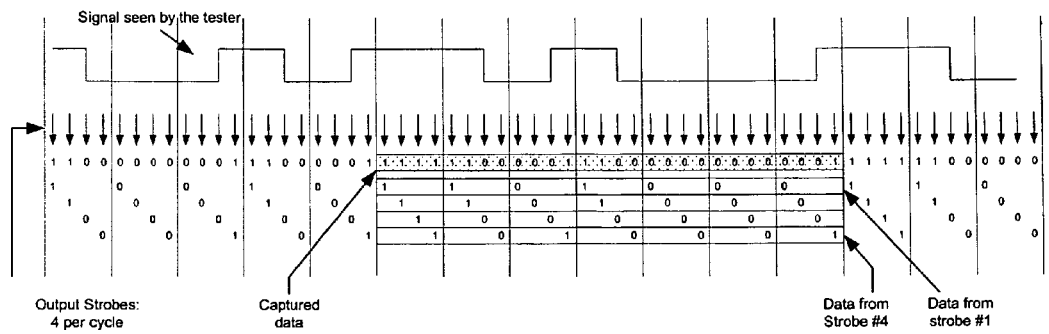
FIG. 4 illustrates an example of data recovery using the capture memory according to specific embodiments of the invention.

FIG. 4 illustrates an example of data recovery using the capture memory according to specific embodiments of the invention. The expected data sequence is 010110100011-00 . . . , but it is not known when the sequence will reach the tester. The capture memory is set to begin capturing at the start of the sixth period and there are four strobe times evenly spaced within each period. The data in the capture memory represents seven periods of the sequence. For every period there are four bits in the capture memory, one from each of the four strobes. In software this data can be split into four arrays, each representing the data captured at the phase offset of its respective strobe, as shown in the white boxes above.

To determine a pass or fail result the algorithm presented in the preceding sub-section is applied for each of the four sequences. If any of the four sequences are found in the expected data stream then the test passes. From careful inspection, one can see that the first and second strobe data match the expected data starting at the $4^{th}$ bit of the expected data. The third strobe was on the edge so no match can be found between the third strobe data and the expected pattern. The fourth strobe can be found starting at the $5^{th}$ bit in the sequence.

Using Data Recovery Emulation (DRE) to Determine a Strobe Time

According to further specific embodiments of the present invention, data recovery emulation (DRE) can further be used to determine an appropriate strobe time for subsequent testing of this particular DUT.

As is generally understood in the art, strobe is a generic term that indicates a clocked comparison of a signal with a (generally programmable or otherwise settable) threshold level. In other words, the strobe is the instant in time that the sampling of the output data is done. This term is at times in the art and herein more broadly used to indicate a group or series of tests or capture events with a defined relation between them, such as the strobe# sets indicated in FIG. 4, FIG. 5, and FIG. 6

The above technique can be used to determine what strobe time (in various embodiments, the start time, the period, or both) to set so that the incoming data stream matches the data in tester main memory. Looking at the example above, the capture memory was taken at the start of period 6. The following conclusions can be made:

1. There might have been a transition near the time of the third strobe time because the third strobe data was not matched anywhere.

2. The actual data lags the expected data by at least 6−4=2 bit periods

3. The data edge is definitely between the strobe times of strobe #2 and Strobe #4 because they both matched the pattern, but the matches were on successive matching locations (starting at the $4^{th}$ and $5^{th}$ bit, respectively) of the expected sequence.

Combining (2) and (3) it can be determined that the delay between the expected data and the actual data stream is:

$$\text{delay} = (6-4)*\text{period} + \frac{\text{strobe\_time\_of\_\#2} + \text{strobe\_time\_of\_\#4}}{2}$$

where the number 6 is the period in which the capture memory began. Of course, the strobes are evenly spaced so the result of the calculation is exactly the same as if conclusion #1 above were assumed and calculated $$\text{delay}=(6-4)*\text{period}+\text{strobe\_time\_of\_\#3}$$

Using the first method to calculate, calculates the average of the strobe times where it is known there was an edge (due to the shift in matching location). There is a danger in just leaping to the conclusion that no match means that the strobe fell on an edge. What if jitter caused strobes #2 and #3 to fail? Where would the edge be?

To provide a further understanding, consider the following specific example. If all data samples were found then (a) some would be found in a different period, and so the delay can be calculated based on the time of the last strobe in period "n" and the first strobe in period "n+1." Suppose strobes 1 and 2 were found in period 4 and strobes 3 and 4 were found in period 5. Then the formula would be: delay $$\text{delay} = (6-4)*\text{period} + \frac{\text{strobe\_time\_of\_\#2} + \text{strobe\_time\_of\_\#3}}{2}.$$

If (b) all strobes were found in the same period, meaning that the data is definitely valid in that period and the actual data edge is determined to have occurred between the last strobe time and the first strobe of the next period, which means that there is no phase offset, although there may be a period offset. Suppose strobes 1, 2, 3 and 4 were found in period 4. Then the delay is calculated as:

$$\text{delay} = (6-4)*\text{period} +$$
$$\frac{\text{strobe\_time\_of\_\#1} + (\text{period} - \text{strobe\_time\_of\_\#4})}{2}.$$

If the strobes are evenly spaced (which they are in this example), then the delay is (6−4)*period.

Thus, according to specific embodiments of the present invention, the second method is better because it relies on passing strobes, not failing ones, and so long as there is at least one passing strobe the delay can be calculated, albeit with only one passing strobe the data eye would be mostly closed and the delay value would have a lot on uncertainty.

Propagation Delay Methods at the Tester's Sneed Limit

Figure 5:
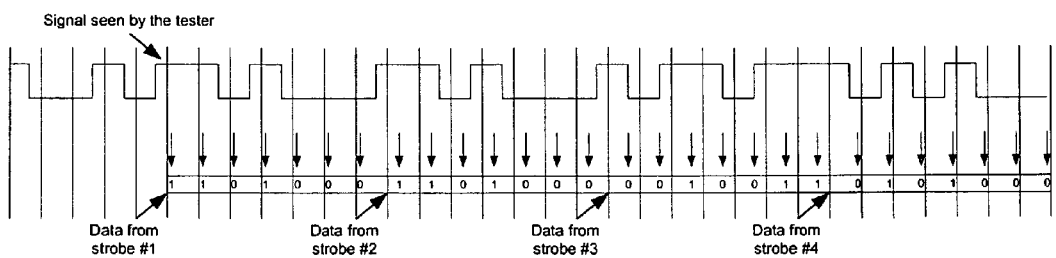
FIG. 5 illustrates an example of example of Data Recovery at-speed using the capture memory according to specific embodiments of the invention.

According to specific embodiments of the invention, the invention can extend the measurement technique so that it operates right at the tester's maximum frequency. Consider the same case as before, but with 4 times the frequency. Now the tester has a minimum period and only one bit of strobe data can be obtained per tester cycle. FIG. 5 illustrates an example of example of Data Recovery at-speed using the capture memory according to specific embodiments of the invention. In this case, instead of capturing 4 different strobe times per data bit period, the different strobe times are used during different tester cycles. Now the first strobe time is used for 7 capture periods, the second strobe time is used for the next 7 periods, and so on. Now the capture data consists of the same number of bits as in the previous case, except that the contents represent different parts of the expected data sequence rather than the same sequence.

Clearly, the size of the number of captured cycles has increased by a factor of 4. The expected data sequence is 01011010001101000101101110101000101 . . . (with added bits since more need to be captured).

Searching for valid data in this case is more complicated because the strobed data was taken at different times. Nevertheless, searching for the data yields the following results:

(a) The first strobe data is found starting in the 4th bit of the expected data (b) The second strobe data is found starting in the 11th bit of the expected data (c) The third strobe data was not found (d) The fourth strobe was found starting at the 26th bit in of the expected data The picture is very much the same as before, except that the data in the strobes has changed and the location in the expected sequence has changed. If one subtracts 7×1=7 from the result of (b), 7×2=14 from the result of (c) (if a match had been found for (c)), and 7×3=21 from the result of (d) the result is exactly the same picture mathematically as in the previous example. Thus, the required strobe delay can be calculated in the same manner.

Propagation Delay Methods Beyond the Tester's Speed Limit

According to further specific embodiments of the invention, this method can be extended beyond the tester's speed by undersampling the output.

Figure 7:
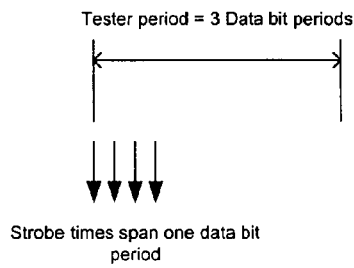
FIG. 7 illustrates an example of undersampling using 4 different strobe times spread through the time span of one data period according to specific embodiments of the invention.
Figure 6:
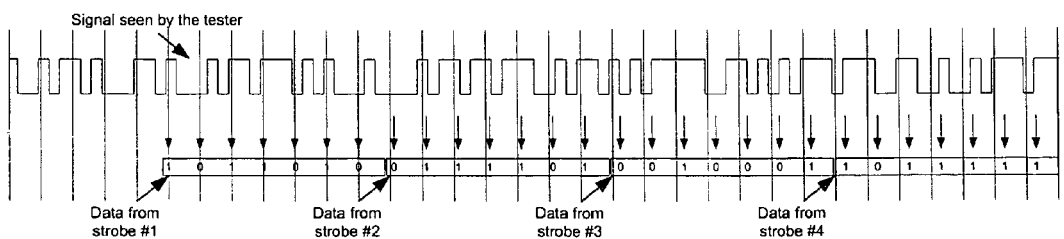
FIG. 6 illustrates an example of data recovery beyond the tester's speed by undersampling according to specific embodiments of the invention.

FIG. 6 illustrates an example of data recovery beyond the tester's speed by undersampling according to specific embodiments of the invention. In the example shown in FIG. 6 the data rate is three times the tester rate so just one bit of capture memory data can be obtained for every three bits of data entering a tester pin. To do the data recovery test for propagation delay, according to further specific embodiments of the invention, a method can "superimpose" the concepts developed thus far with the idea of undersampling. FIG. 7 shows the arrangement of the strobe times within a tester period.

In the case shown in FIG. 7 every third bit of data sent from the device is strobed at the various strobe times so for every third bit the picture looks much like the case of FIG. 5. However, finding a match between the capture memory data and the expected is complicated by the fact that the method now must determine which of the three bits in the incoming data stream we are strobing.

The method for determining the strobe time follows the analysis of FIG. 6. The expected data is:

Expected:
0101101000110100010110111010100010000101101101110010110101010
1111100110101011011100110010010111011101101010.

Somewhere in that sequence, a method according to specific embodiments of the invention should look for the data from the first strobe sequence, 1011010. However, because that strobe data was obtained by sampling every third bit, one should not expect to see it as-is. Rather, one should expect that one should be able to match it to a sequence made from every third bit of the expected data sequence. So, before performing a search, the expected data can be undersampled, to generate THREE expected-data sequences, as shown in the samples below:

Sample#1 01100000100001110001111110110000111
Sample#2 11011011010011110110101010101011001011
Sample#3 000101111010000110110011101111100

It will be seen that these three sequences can be derived by simply copying the bits from left to right of the expected sequence one at a time into Sample#1, then Sample#2, then Sample#3, and back to Sample#1, until all the bits are placed into one of the samples.

Now this embodiment of the invention can search each of the three sequences to find each of the strobe data sequences. The first strobe sequence, 1011010, is found in the second sample starting at the 5$^{th}$ bit position, as shown below in underlined text.

Sample#1 01100000100001110001111110110000111
Sample#2 11011011010011110110101010101011001011
Sample#3 000101111010000110110011101111100

The invention can then search for the second strobe data, 0111101 just after the end of the first, in sample #2 starting at bit 12. Looking there we find the second sequence:

Sample#1 01100000100001110001111110110000111
Sample#2 11011011010011110110101010101011001011
Sample#3 000101111010000110110011101111100

Similarly, the invention should then seek out the third set of strobe data, 0010011 starting at the end of the second, starting at bit 19. But searching there yields no match.

Now, because the invention has determined where strobe data sequences #1 and #2 are, the invention can conclude that the time of strobe #3 is either coincident with the data edge or past the data edge. If the strobe is past the edge, the invention should expect to find a positive match for strobe data sequence #3 in Sample #3 at bit position 19. In this case searching there again yields no match, so the invention concludes that the strobe time of strobe #3 coincided with an edge and that the data in the capture memory is invalid. Nevertheless, the invention can still search out strobe data sequence #4 (1011111) to verify that it has found the edge. The spot to look is in sequence #3 (because the searching has passed an edge) at the bit position 19+7=26. It is indeed found there verifying that the edge fell somewhere between strobe time #2 and #4.

The invention can now calculate the edge time needed to make the tester main memory coincide with the device output.

First, the invention calculates the tester cycle in which the edge occurred. The first match occurred in bit #5. Regardless of which sample it was found in, bit 5 is tester cycle 5. The second strobe matched in the same sample (sample #2), so the edge position cannot be determined from that alone. What is of interest is that the next match between the expected data and the capture memory was strobe #4, at bit position #26. To determine if the edge is in the same cycle, the invention can "refer" the match location back to the fifth tester cycle and see if the tester cycle boundary has been crossed. The invention subtracts 3*7=21 from 26 to get 5 and can then conclude that the edge occurred within tester cycle #5. The capture memory logging began in cycle #6, so the edge is somewhere between (6−5)−1=0 and 6−5=1 tester cycles.

Second, the invention needs to determine where the edge occurred in tester cycle 5. Since the invention found the data for strobe #2 in sequence #2 and the strobe data for #4 was NOT found in sequence #2, it can be determined that that the phase offset of the edge lies somewhere between the time of Sample #2, strobe #2 and sample #3 strobe #4.

The following conclusions can thus be drawn in this case:

1. Strobing started in tester cycle 6 but the match was found in tester cycle 5 so the delay is less than one tester cycle.

2. A match was found in sample #2 so the delay is more than one data bit period.

3. The edge is between strobe #2 and #4. The delay can be calculated as follows: delay $$delay = (6 - 5 - 1) * tester\_period + (2 - 1) * bit\_period + \frac{strobe\_time\_\#2 + strobe\_time\_\#4}{2}$$

Which, in this case, is just under three bit periods. Careful examination of FIG. 6 reveals that this is the correct starting time of the expected sequence 010110 . . .

Creating a Functional Test

With the propagation delay thus measurable for virtually any data sequence without restriction of data or use of external equipment, a system according to further specific embodiments of the invention can perform a functional test in at least two ways: (1) Use the capture-memory and the search routine to determine a pass/fail result directly; (2) Use the capture memory and the search routine to find the delay, then add this delay to the strobe times of the regular functional test to align the main memory with the device's timing delay, and then run a regular functional test using the tester's main memory to obtain the pass./fail result.

Embodiments in a Programmed System

The invention can be implemented in hardware and/or software. The invention may be embodied in a fixed media or transmissible program component containing logic instructions and/or data that when loaded into an appropriately configured computing device (such as an ATE or ATE workstation) cause that device to perform according to the invention.

Figure 8:
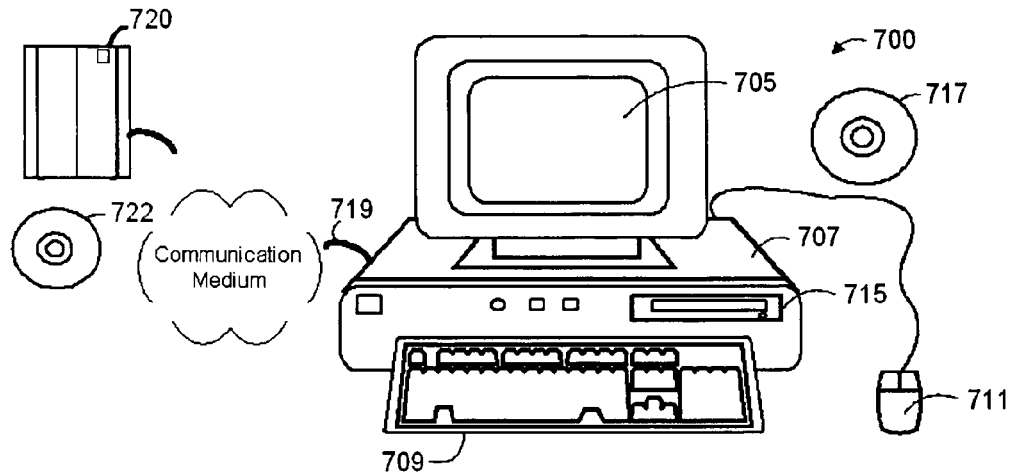
FIG. 8 is a block diagram showing a representative example logic device in which various aspects of the present invention may be embodied, in one example aspect related to a workstation as discussed herein.

FIG. 8 shows digital device 700 that may be understood as a logical apparatus that can read instructions from media 717 and/or network port 719. Apparatus 700 can thereafter use those instructions to direct a server or communication device or application as is known in the art and that further includes the components of the invention. One type of logical apparatus that may embody the invention is a computer system as illustrated in 700, containing CPU 707, optional input devices 709 and 711, disk drives 715 and optional monitor 705. Fixed media 717 may be used to program such a system and may represent a disk-type optical or magnetic media or a memory. The invention may be embodies in whole or in part as software recorded on this fixed media. Communication port 719 may also be used to program such a system and may represent any type of communication connection. Thus device 700 can be understood as an ATE system or a part of an ATE system, such as a workstation.

The invention also may be embodied in whole or in part within the circuitry of an application specific integrated circuit (ASIC) or a programmable logic device (PLD). In such a case, the invention may be embodied in a computer understandable descriptor language which may be used to create an ASIC or PLD that operates as herein described.

An Example ATE system

Figure 9:
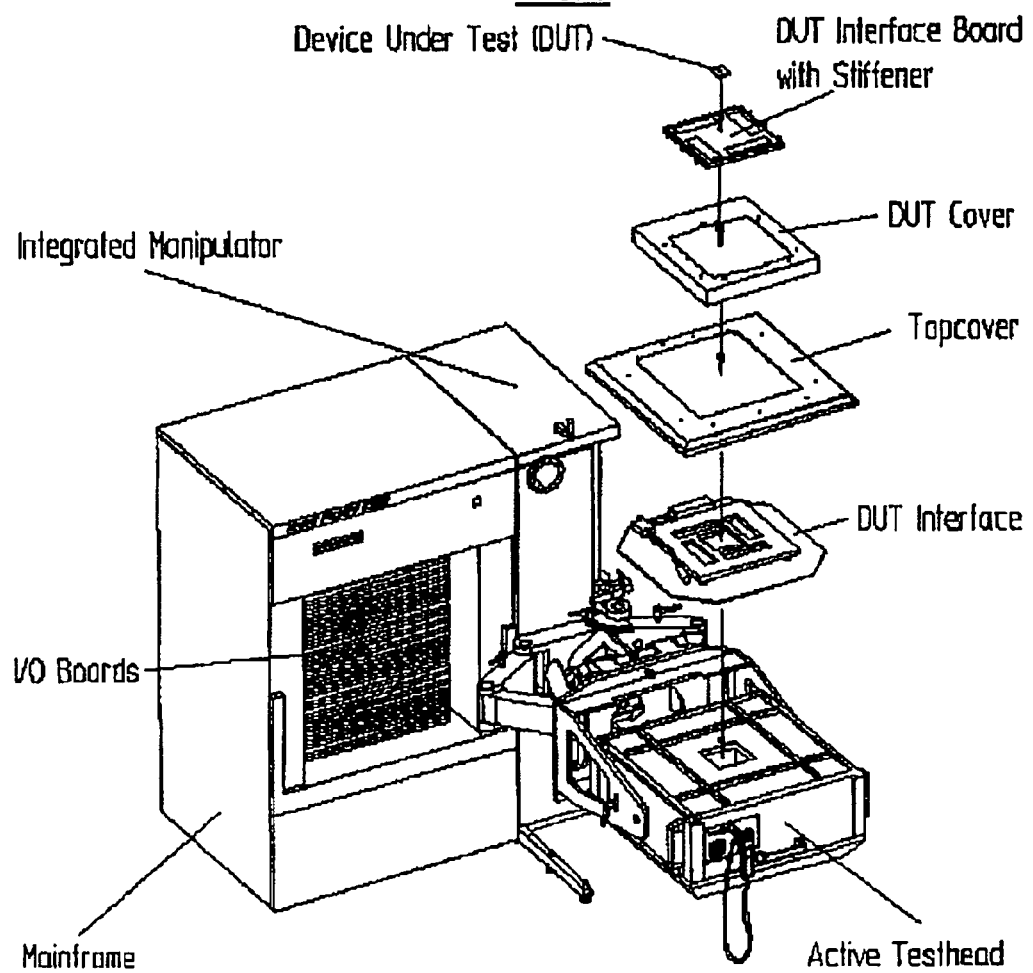
FIG. 9 illustrates an example of a type of automatic test equipment that may be employed according to specific embodiments of the invention.

FIG. 9 illustrates an example of a type of automatic test equipment that may be employed according to specific embodiments of the invention. As will be understood in the art from the teachings herein, this figure illustrates an exploded diagram of a DUT interface with an ATE system. In this type of example system, various 'testheads' (or sockets) can be used to interface with a packaged DUT or a wafer prober via a wafer prober interface, or a handler.

Embodiments in an Integrated Circuit

According to specific embodiments, the present invention can be embodied in a variety of integrated circuit components that are verified or tested in accordance with one of more of the methods taught herein. Examples of such components are provided in the attached appendix, but any type of integrated circuit or logical device or system incorporating an integrated circuit or logical device may embody the invention if tested in accordance with the methods herein. Such devices can include, but are not limited to, application specific integrated circuits (ASIC) or systems incorporating such circuits; programmable logic devices (PLD) or systems incorporating such devices; advanced communication integrated circuits or systems incorporating such circuits; microprocessor circuits or systems incorporating such circuits, etc.

The invention may also be embodied in various virtual validation systems that are known and may be used "prefabrication" to validate logical designs, such as designs implemented in computer understandable descriptor language.

Other Embodiments

The invention has now been explained with reference to specific embodiments. Other embodiments will be apparent to those of skill in the art. In particular, the client's digital computing device has been illustrated as a personal computer.

While methods according to specific embodiments of the invention are explained above through specific example, it will be understood from the teachings herein that the invention can be extended to any combination of the following variables:

1. Strobes-per-data-bit-period ("local" oversampling),
2. The distribution of the strobe time phases. This discussion has suggested equal spacing to give a constant certainty but the strobe times can in other embodiments be distributed in any order and follow any time distribution.
3. Undersampling factor (grouping those strobes within one period time)
4. Undersampling and not grouping the strobes in the same sample (e.g. strobe at T, $2T+T/N, 3T+2T/N, \ldots, NT+(N-1)T/N$)
5. The length of the data sequence captured per strobe (each may be unique rather than simply N)
6. Captured bits need not be adjacent in the sequence.

According to further specific embodiments, the present invention can be used to test and manufacture cables. In such an application, the invention may be used to determine the propagation delay of a medium, such as a fiber-optic cable (in the case of an optical datapath and suitable test equipment), coaxial cable or a printed circuit board trace, by using the test equipment (ATE or other "bench" equipment with the capability to implement the invention) to source a known data sequence into one end of the transmission path where the invention acts on the other end. The measured delay value can be corrected according to the time difference between the data launch (from the source end) to the expected capture (on ATE this "calibration" is inherent and well known) resulting in a propagation delay value for that medium.

It is understood that the examples and embodiments described herein are for illustrative purposes only and that various modifications or changes in light thereof will be suggested to persons skilled in the art and are to be included within the spirit and purview of this application and scope of the appended claims. All publications, patents, and patent applications cited herein are hereby incorporated by reference in their entirety for all purposes.

What is claimed is:

1. A method of performing testing on a digital device using automated test equipment comprising:

storing capture memory contents as captured data;

using a logic algorithm, searching between said captured data and a set of expected data to determine one or more matches between said captured data and said expected data; and prior to running a test cycle on a digital device, setting a condition on said test equipment such that pass/fail states normally stored in said test equipment's capture memory represent a sampling of output data of said digital device rather than pass/fail results of a test performed by said testing equipment.

2. The method according to claim 1 wherein said condition comprises setting up the capture memory for data recovery by setting pattern memory on said test equipment to an expect zeros state.

3. A method of performing testing on a digital device using automated test equipment comprising:
storing capture memory contents as stored captured data;
using a logic algorithm, searching between said stored captured data and a set of expected data to determine one or more matches between said stored captured data and said expected data;
storing a section of expected data;
subsequently capturing a portion of an incoming data stream in a time vicinity of said expected data; and
applying an algorithm using a computing device to search for matching instances between said portion of an incoming data stream data and said stored expected output data.

4. The method according to claim 3 further comprising:
defining K strobe times in a tester period where one bit of capture memory is obtained per strobe per period; and
splitting said captured data into K data sequences, each of which can be searched for against said expected data.

5. The method according to claim 4 further comprising:
defining K strobe times over K different tester periods; and
considering each captured data sequence during each strobe time to be a separate data sequence to be searched against said expected data to identify one or more matches.

6. The method according to claim 5 further comprising:
subsequently using said location within the expected data where each of one or more matches is found to calculate a delay.

7. The method according to claim 4 further comprising:
when there are Q>1 bits of incoming data per tester period, using undersampling combined with:
grouping strobe locations into one bit period;
splitting said strobe locations into K periods;
splitting of the capture memory into K data sequences;
splitting the expected data into Q sequences;
applying search techniques to find one or more matches between each of the
K data sequences and any of the Q expected data sequences; and
subsequently calculating a delay.

8. The method according to claim 3 further comprising:
using a location within the expected data where each of one or more matches is found to calculate a delay between a start time of said expected data and a start time of said captured data.

9. The method according to claim 8 further comprising:
adjusting an expected start time of said expected data using said delay so that the timing of said expected data more closely matches timing of said digital device; and
repeating testing of said digital device.

10. The method according to claim 8 further comprising:
realigning said expected data using said delay in order to match the start time of said captured data; and
repeating testing of said digital device using said realigned expected data.

11. A communications system electronic component verified in accordance with the method of claim 3.

12. An integrated circuit verified in accordance with the method of claim 3.

13. A wafer containing circuitry verified in accordance with the method of claim 3.

14. An information processing system comprising at least one integrated circuit verified in accordance with the method of claim 3.

15. A communication system comprising at least one integrated circuit verified in accordance with the method of claim 3.

16. An electronic system electronic component verified in accordance with the method of claim 3.

17. A computer readable medium containing computer interpretable instructions that when loaded into an appropriately configuration information processing device will cause the device to operate in accordance with the method of claim 3.

18. A computer readable medium containing computer interpretable instructions that when loaded into an appropriately configuration information processing device will cause the device to operate in accordance with the method of claim 3 in an emulation system.

19. A test system comprising:
an interface exchanging data with a device under test;
a controller with settable test conditions, wherein a test condition is set to sample or capture data at an output pin without comparing that data to a changing pattern of expected data;
a capture memory for capturing results of said test condition; and
a processor with a processor memory able to receive capture results and performing searching and testing of said capture results to one or more patterns stored in said processor memory.

20. The system according to claim 19 further where there is included a deliberately positioned error map and using said deliberately positioned error map to determine the pass/fail results of the test rather than the traditional pass/fail results provided by built-in tester software.

21. A computer readable medium containing computer interpretable instructions describing a circuit layout for an integrated circuit that, when constructed according to said descriptions, will configure a circuit to embody the apparatus described in claim 19.

22. A test system for testing a high speed device under test with a lower speed tester comprising:
means for interfacing with said device under test;
means for setting a test condition of said tester to sample or capture data at a production output pin of said device under test;
means for capturing and storing results of said test condition; and
means for receiving capture results and performing searching and testing of said received capture results to one or more stored sets of expected data patterns.

* * * * *